United States Patent [19]

Thomas, Jr.

[11] 4,229,702

[45] Oct. 21, 1980

[54] CIRCUIT FOR DETECTING THE RELATIVE OCCURRENCE OF ONE SIGNAL AMONG A PLURALITY OF SIGNALS

[75] Inventor: James W. Thomas, Jr., Valparaiso, Ind.

[73] Assignee: Teletype Corporation, Skokie, Ill.

[21] Appl. No.: 955,727

[22] Filed: Oct. 27, 1978

[51] Int. Cl.² .................... H03K 5/20; H03K 5/159
[52] U.S. Cl. ................................. 328/110; 328/55
[58] Field of Search ............... 307/232; 328/133, 134, 328/141, 155, 109, 110, 119, 55

[56] References Cited

U.S. PATENT DOCUMENTS

| | | | |
|---|---|---|---|
| 3,112,450 | 11/1963 | Krause | 328/109 |
| 3,327,226 | 6/1967 | Nourney | 328/109 |
| 3,532,994 | 10/1970 | Ferrier | 328/109 |
| 3,600,690 | 8/1971 | White | 328/133 |
| 4,105,947 | 8/1978 | Crowley | 328/134 X |

Primary Examiner—John S. Heyman
Attorney, Agent, or Firm—J. C. Albrecht; W. K. Serp

[57] ABSTRACT

A circuit for detecting the relative time of occurrence of first and second signals applied to first and second terminals includes a pair of bistable flip-flops. In response to the occurrence first of the first signal the first one of the flips-flops is set to initiate the generation of a control signal. A time delay responds to the control signal and upon expiration of the time delay interval the second one of the flip-flops is set and this in turn resets the first flip-flop to terminate the control signal. In response to the first occurrence first of the second signal the second one of the flip-flops is set and this inhibits the setting of the first flip-flop. In the event that the first and second signals occur simultaneously the second flip-flop sets quickly resetting the first flip-flop. In response to either signal, a conductive path is established between the terminals.

9 Claims, 2 Drawing Figures

4,229,702

CIRCUIT FOR DETECTING THE RELATIVE OCCURRENCE OF ONE SIGNAL AMONG A PLURALITY OF SIGNALS

DESCRIPTION

Technical Field

This invention relates to a circuit for detecting the relative occurrence of one signal among a plurality of signals and for providing a control signal related thereto.

Background Art

Frequently, several signal sources are connected to a common bi-directional bus with selected receiving locations also connected to the bus. Each receiving location, under such conditions, is often unable to determine which source originated the signal. Occasionally two or more signal sources may initiate signals simultaneously creating what is potentially an indeterminate condition. Prior sensing devices such as that described in U.S. Pat. No. 3,967,137 issued June 29, 1976 to Reiter and entitled "Circuit Arrangement for Weighting A Current According to Magnitude and Direction" are not voltage sensitive but require current flow through the conductor. Such current sensitive devices are not suitable for use in voltage responsive MOS circuits.

DISCLOSURE OF THE INVENTION

A circuit is described for generating a control signal in response to the occurrence first of a first signal from one of a plurality of signal sources. Each signal source is connected to at least one of a plurality of circuit inputs. The circuit includes means responsive to the level of the first signal for generating a control signal and means responsive to the occurrence first of a second signal from one of said plurality of signal sources for inhibiting the control signal generating means in response to the subsequent occurrence of the first signal. Additionally, the circuit includes means responsive to the occurrence first of a signal from the first signal source for determining the time duration of the control signal and means responsive to the simultaneous occurrence of both the first and second signals for inhibiting the generation of the control signal.

More particularly, the circuit includes a bistable flip-flop placed in a first state in response to the occurrence first of the first signal and a second dominant bistable flp-flop inhibiting the operation of the first flip-flop. The first flip-flop being responsive to the first signal and the second flip-flop being responsive to the second signal. Means are included for providing a conductive path between the inputs to the circuit in response to the presence of either signals.

THE DRAWINGS

DETAILED DESCRIPTION

Figure 1:
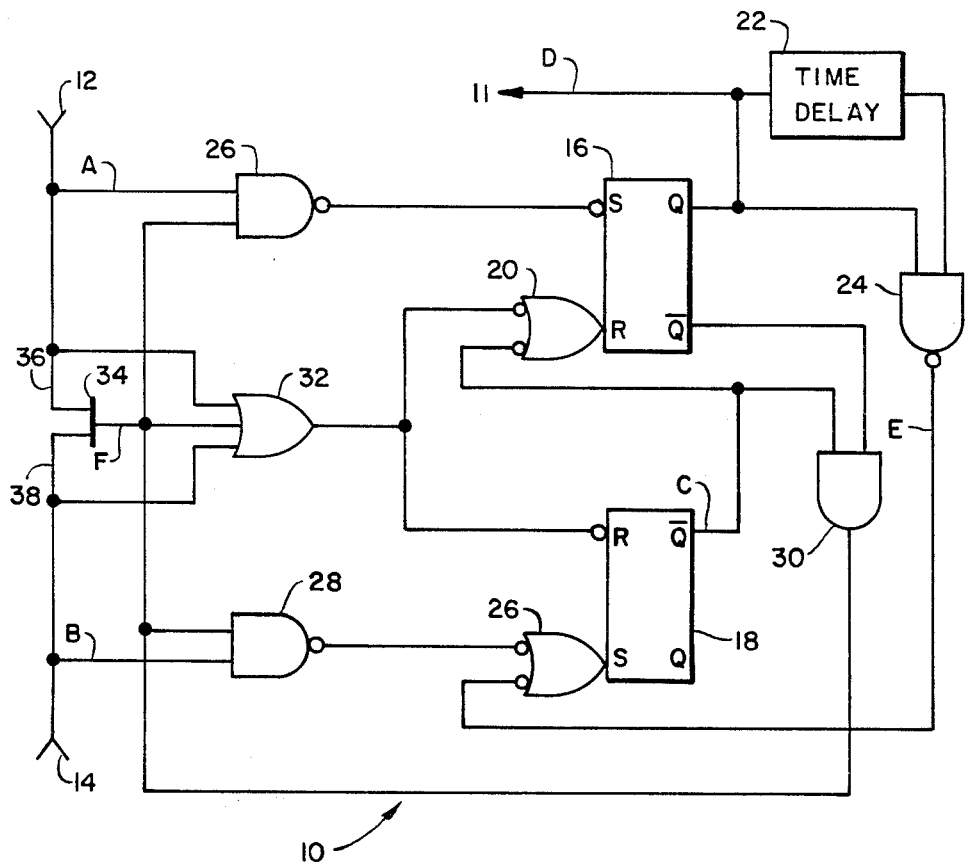
FIG. 1 is a schematic diagram of a circuit including certain features of this invention.

The circuit 10 of FIG. 1 generates a short duration control signal at output 11 in response to a high signal A at an input terminal 12. In response to the occurrence first of a signal B at the second input 14 no control signal is generated nor is the control signal generated upon the simultaneous occurrence of signals A and B.

The circuit 10 includes a pair of RS flip-flops 16 and 18 each including set S and reset R inputs as well as direct Q and complement $\bar{Q}$ outputs. The complement output $\bar{Q}$ of the flip-flop 18, signal C, is connected to an active low input of a dual OR-gate 20 feeding the reset input of the flip-flop 16. This connection prevents setting of the flip-flop 16 once the flip-flop 18 has been set. That is, the flip-flop 18 is the dominant of the two flip-flops. The direct output, signal D, of the flip-flop 16 feeds the output terminal 11 as well as the input of a time delay 22 which together with the direct output Q of the flip-flop 16 is fed to separate inputs of a dual input NAND-gate 24. The output of the NAND-gate 24 signal E, provides a reset pulse to one active low input of dual input OR-gate 25 feeding the set terminal of the B flip-flop 18.

The input signals A and B at the terminals 12 and 14 are respectively fed to one input of dual input NAND-gates 26 and 28. The output of the NAND-gate 26 controls the active low set terminal of the flip-flop 16 and the NAND-gate 28 controls flip-flop 18 via the remaining active low input of the OR-gate 25. The remaining input to each of the AND-gates 26 and 28 is commonly fed from the output signal F, of a dual input AND-gate 30 fed by the complement outputs of the flip-flops 16 and 18. Thus, the outputs of the NAND-gates 26 and 28 will respond to the level at the input terminals, that is go low, only when both flip-flops 16 and 18 are in their reset condition which is also the initialized condition of the circuit. The remaining input of the dual input OR-gate 20 as well as the active low reset input of the flip-flop 18 are fed from the output of a triple input OR-gate 32. Two of the inputs to the OR-gate 32 are connected to the input terminals 12 and 14 with the third input being fed by the output of the AND-gate 30. Additionally, the AND-gate 30 also feeds the gate of a P MOS field-effect transistor 34 the electrodes 36 and 38 of which are respectively connected to the input terminals 12 and 14. It will be appreciated that in response to a low level at the output of the AND-gate 30 the transistor 34 will be turned ON providing a bi-directional conductive path between terminals 12 and 14.

Figure 2:
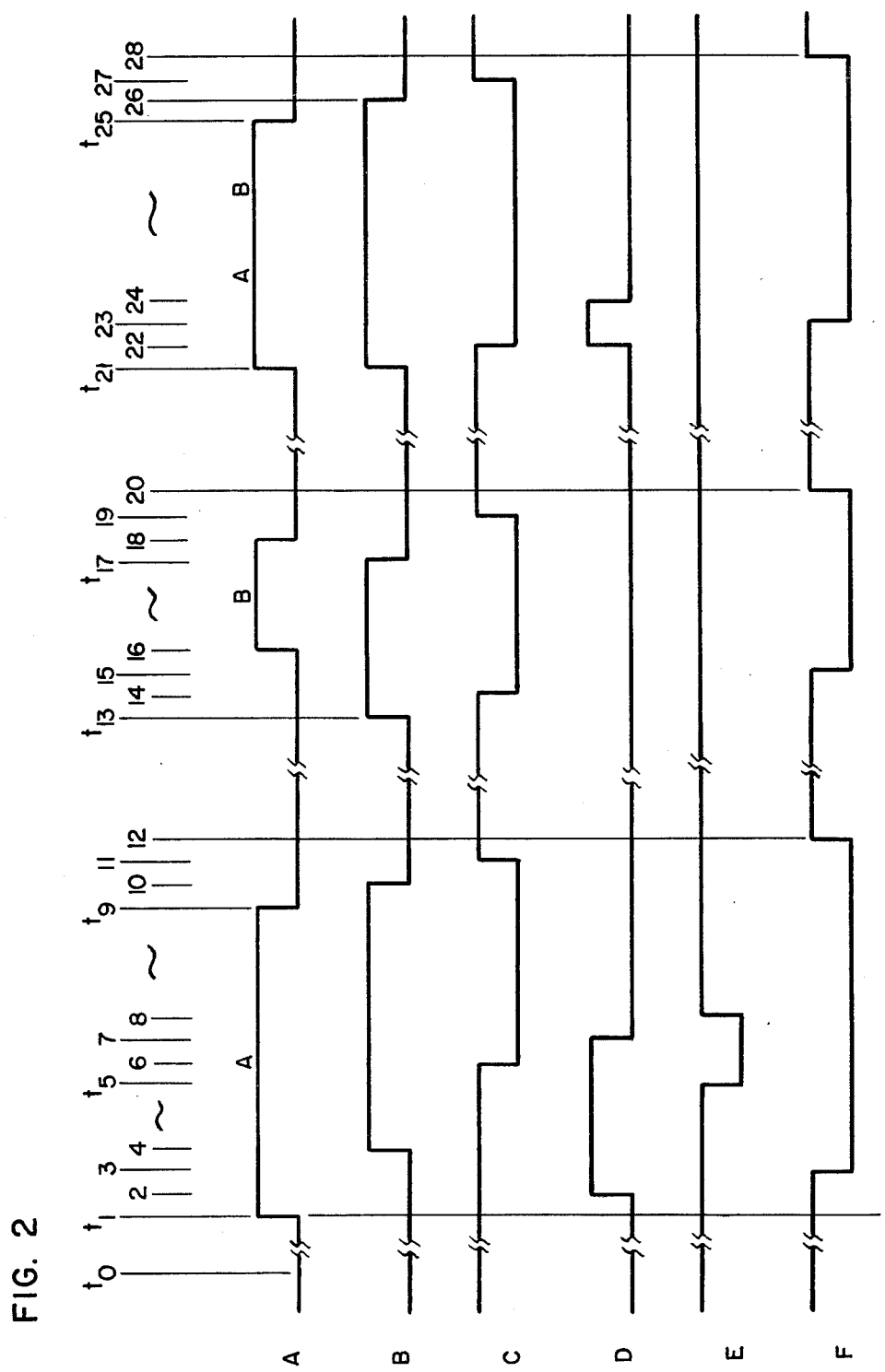
FIG. 2 is a timing diagram of the operation of the circuit of FIG. 1 during exemplary operational conditions.

The timing diagram of FIG. 2 illustrates selected signals during three operational modes of the circuit of FIG. 1. Time periods $t_0$ through $t_{12}$ illustrate the operation of the circuit 10 in response to the occurrence first of a high going signal A at terminal 12. Time period $t_{13}$–$t_{20}$ illustrates the circuit 10 in response to a first high going signal B at terminal 14 and time period $t_{21}$–$t_{28}$ illustrates the response of the circuit to the simultaneous presence of signals A and B at terminals 12 and 14. Power is applied to the circuit at $t_0$ with both signals A and B low. In the event either of the flip-flops 16 or 18 come up set with their complement outputs $\bar{Q}$ low, a low signal F appears at the output of the reset AND-gate 30 with the output of the OR-gate 32 also going low. Thus, should either of the flip-flops 16 or 18 come up in their set state they will automatically be reset by the output of the OR-gate 32. In response to a high signal A at input 12, occurring at t, the output of the NAND-gate 26 goes low setting the A flip-flop 16. The time interval $t_1$–$t_2$ is the propogation delay through the gate 26 and the flip-flop 16. At time $t_2$ the output D of the flip-flop 16 goes high. Since the complement output $\bar{Q}$ of the flip-flop 16 is low, the output F of the reset AND-gate 30 will go low placing a low signal at time $t_3$ at the gate of the FET transistor 34 providing a bi-directional conductive path between the terminals 12 and 14. After the propogation delay $t_3$–$t_4$ of the transistor 34, terminal 14 signal B follows the level of signal A. The conductive path between the terminals 12 and 14 is maintained as long as a high signal is present at either of the terminals 12 or 14. Thus, the circuit 10 provides a high control signal D at terminal 11 in response to terminal 12 going high before the terminal 14, and the conductive path between the terminals is maintained so long as either terminal is held high. At $t_5$ the interval of the time delay 22 has expired and the output of the time delay 22 goes high. Correspondingly, the output of the NAND-gate 24 goes low which sets the flip-flop 18. The complement output signal C of the flip-flop 18 goes low which resets the flip-flop 16 terminating control signal at time $t_7$. With one input to the NAND-gate 24 now low, the output E goes high at time $t_8$. The time interval $t_5$–$t_8$ being the series propogation delay of the two flip-flops 16 and 18 and the gate 24. Thus, in response to input 12 going high, the output terminal 11 goes high for a duration determined by the time delay 22. So long as either terminals 12 or 14 are held high, the circuit will retain the signal levels of time $t_8$. For purposes of discussion it is assumed that the signal source at terminal 12 goes low at $t_9$. With all inputs to the OR-gate 32 now low, the flip-flop 18 resets with signal C going high at $t_{11}$. Additionally, flip-flop 16 will also reset if not previously reset. After the propogation delay through the gate 30, signal F also returns high turning transistor 34 off. During the time interval $t_1$ to $t_{12}$, the signal source (not shown) connected to the terminal 14 did not drive high but received a high signal from terminal 12. Should the source at terminal 14 drive high prior to removal of the drive signal applied to terminal 12, both terminals will now follow the source at terminal 14 thus maintaining a high even with the source connected to terminal 12 not driving high.

As mentioned, time interval $t_{13}$ to $t_{20}$ illustrates a condition wherein the signal source connected to terminal 14 is initially brought high. At time $t_{13}$, in response to signal B, the output of the NAND-gate 28 goes low setting flip-flop 18 and the complement output $\overline{Q}$ thereof goes low at $t_{14}$. The output of the AND-gate 30 goes low at 15 turning on the transistor 34 with the terminal 12 going high at $t_{16}$. In response to the low level of signal F the transistor 34 provides a conductive path from terminal 14 to terminal 12. Since, as previously mentioned, the flip-flop 18 is dominant the flip-flop 16 is held in its reset mode and signal D at the terminal 11 remains low. This circuit state is maintained until the signal source (not shown) holding terminal 14 high goes low at time $t_{17}$. With both input terminals 14 and 16 low at $t_{18}$, and with the output of the AND-gate 30 low, all three inputs to the OR-gate 32 are low with the flip-flops 16 and 18 resetting at $t_{19}$ and signal F goes back high at $t_{20}$ turning off the transistor 34. Thus, a control signal of predetermined width is generated in response to the input terminal 12 initially going high and no output signal is generated when the terminal 14 is the first to go high.

In the third condition illustrated by the timing diagram ($t_{21}$–$t_{28}$) both inputs 12 and 14 are brought high simultaneously. At $t_{21}$ the input goes high and after a short propogation delay the flip-flop 16 sets bringing the direct output Q high and correspondingly the flip-flop 18 also sets with the complement output $\overline{Q}$ thereof going low. A low signal appears at the base of the transistor 34 and a bi-directional conductive path is established between the two input terminals 12 and 14. The slight propogation delay introduced by the NAND-gate 30 is illustrated as the time interval $t_{22}$ and $t_{23}$. Finally, at $t_{24}$ the control signal D returns low having maintained its high condition for an extremely short interval $t_{22}$ and $t_{24}$. It will be appreciated that this output spike may be easily filtered by an RC network or used as a second control signal indicating the simultaneous occurrence of both signal sources connected to terminals 12 and 14 driving high. Alternately, the output spike ($t_{22}$–$t_{24}$) may be gated with the output of the NAND-gate 24 and thus eliminated. If desired, the output of the NAND-gate 24 may be used as an output signal. The circuit returns to its initial state during time interval $t_{25}$–$t_{28}$.

A circuit has been described which is sensitive to the voltage level of the signals applied to the inputs 12 and 14 generating an output pulse of predetermined duration when the input 12 is brought high first before any change in input 14 and does not provide a control signal when the inputB is brought high prior to any change in input 12 or simultaneously therewith.

Although this invention has been shown and described with reference to a single embodiment thereof, it will be understood that various changes in form and detail may be made without departing from the spirit and scope of the invention as set forth in the following claims.

What is claimed is:

1. A circuit for detecting the relative time of occurrence of one signal among a plurality of signals and generating a control signal in response to the occurrence first of a first one of the signals, each signal being connected to at least one of a plurality of circuit inputs, the circuit includes means responsive to the level of said first signal for generating the control signal, means responsive to the occurrence of a second one of said plurality of signals for inhibiting the control signal generating means in response to the subsequent occurrence of said first signal, the improvement. characterized by:

means responsive to the occurrence of either of said first or said second signals for providing a conductive path between said first signal input terminal and said second input terminal.

2. The circuit of claim 1 further characterized by:

means responsive to the occurrence first of said first signal for establishing the time duration of said control signal independent of the time of occurrence of said second signal.

3. The circuit of claim 2 further characterized by means responsive to the simultaneous occurrence of both said first and second signals for inhibiting the generation of said control signal.

4. A circuit for detecting the relative time of occurrence of one signal among a plurality of signals and generating a control signal in response to the occurrence first of a first one of the signals, each signal being connected to at least one of a plurality of circuit inputs, the circuit includes means responsive to the level of said first signal for generating the control signal, means responsive to the occurrence first of a second one of said plurality of signals for inhibiting the control signal generating means in response to the subsequent occurrence of said first signal characterized by:

means responsive to the occurrence first of said first signal for establishing the time duration of said control signal independently of the occurrences of said second signal.

5. The circuit of claim 4 further characterized by means responsive to the simultaneous occurrence of both said first and second signals for inhibiting the generation of said control signal.

6. The circuit of claim 3 further characterized by said means responsive to said first signal including a bistable flip-flop placed in its first state in response to the occurrence first of said first signal and said means responsive to the occurrence first of said second signal including a second dominant bistable flip-flop said second flip-flop serving to inhibit the operation of said first flip-flop in response to the occurrence first of said second signal.

7. The circuit of claim 6 wherein the state of said first flip-flop serves to actuate said control signal time duration means.

8. The circuit of claim 7 further characterized by said means providing a conductive path between said inputs being a bi-directional device thus allowing either signal to pass the alternate input.

9. The circuit of claim 8 further characterized by means responsive to the absence of said plurality of input signals for resetting the circuit to an initial condition.

* * * * *

UNITED STATES PATENT OFFICE
CERTIFICATE OF CORRECTION

PATENT NO. : 4,229,702
DATED : Oct. 21, 1980
INVENTOR(S) : James W. Thomas, Jr.

It is certified that error appears in the above-identified patent and that said Letters Patent are hereby corrected as shown below:

ABSTRACT, line 5, change "flips-flops" to --flip-flops--.

DRAWING, FIG. 1, change the number "26" designating the OR gate feeding the S input of the flip-flop 18 to reference number --25--.

Signed and Sealed this

Seventh Day of April 1981

[SEAL]

Attest:

RENE D. TEGTMEYER

*Attesting Officer*  *Acting Commissioner of Patents and Trademarks*